United States Patent [19]

Gutentag

[11] Patent Number: 5,203,143
[45] Date of Patent: Apr. 20, 1993

[54] MULTIPLE AND SPLIT PRESSURE SENSITIVE ADHESIVE STRATUMS FOR CARRIER TAPE PACKAGING SYSTEM

[75] Inventor: Charles Gutentag, Los Angeles, Calif.

[73] Assignee: Tempo G, Los Angeles, Calif.

[21] Appl. No.: 856,655

[22] Filed: Mar. 28, 1992

[51] Int. Cl.⁵ .................................. B65B 15/04
[52] U.S. Cl. ........................... 53/452; 206/330
[58] Field of Search ............. 206/328, 330–332, 206/820; 53/452

[56] References Cited

U.S. PATENT DOCUMENTS

| | | |
|---|---|---|
| 2,885,849 | 5/1959 | Wohlman, Jr. . |
| 3,177,629 | 4/1965 | Anspach . |
| 3,608,711 | 9/1971 | Wiesler et al. . |
| 3,691,436 | 9/1972 | Maijers et al. . |
| 3,695,414 | 10/1972 | Wiesler et al. ............ 206/330 |
| 3,785,507 | 9/1971 | Wiesler et al. . |
| 3,881,245 | 5/1975 | Dudley et al. . |
| 3,971,193 | 7/1976 | Tardiff et al. . |
| 4,298,120 | 11/1981 | Kaneko . |
| 4,340,774 | 7/1982 | Nilsson et al. . |
| 4,575,995 | 3/1986 | Tabuchi et al. . |
| 4,702,788 | 10/1987 | Okui ....................... 206/330 |
| 4,724,954 | 2/1988 | Sillner . |
| 4,954,207 | 9/1990 | Higuchi et al. . |
| 4,966,282 | 10/1990 | Kawanishi ............... 206/330 |

FOREIGN PATENT DOCUMENTS

| | | | |
|---|---|---|---|
| 0127255 | 5/1990 | Japan ................... | 206/330 |
| 7907599 | 4/1981 | Netherlands ......... | 206/330 |
| 2083000 | 3/1982 | United Kingdom .. | 206/330 |

*Primary Examiner*—Jimmy G. Foster
*Attorney, Agent, or Firm*—Thomas I. Rozsa; Dong Chen

[57] ABSTRACT

The present invention utilizes multiple and split pressure sensitive adhesive (PSA) tape stratums for carrier tape packaging systems to receive, retain and release small components in automated assembly processing. A carrier tape includes many small apertures which extend through the thickness of the carrier tape. Each aperture is designed to carry a small component. The present invention utilizes a pair of parallel lengths of pressure sensitive tape which are separated by a gap to retain each component within its respective aperture.

2 Claims, 2 Drawing Sheets

(Section on line 7 – 7)

MULTIPLE AND SPLIT PRESSURE SENSITIVE ADHESIVE STRATUMS FOR CARRIER TAPE PACKAGING SYSTEM

BACKGROUND OF THE INVENTION

1. Field of the Invention

This invention relates to the field of automated packaging systems. Specifically, the present invention relates to carrier tape packaging systems utilizing pressure sensitive adhesive (PSA) tape. More particularly, the present invention refers to the usage of multiple and split PSA tape stratums for a carrier tape packaging system.

2. Description of the Prior Art

The present invention relates to a carrier tape packaging system for small components utilizing pressure sensitive adhesive (PSA) tape stratums.

Small components such as integrated circuit (IC) devices, are particularly susceptible to damage by mechanical forces and by electro-static discharge. Mechanical stress to the surface of the IC can cause structural damage to internal locations at points within the IC which are particularly susceptible to physical distortion. Therefore, it would be a significant advantage if small components such as ICs could be packaged and removed from the package in a manner which reduces the mechanical stress applied to the IC and, simultaneously, eliminates the source of much electro-static charge buildup during automatic handling.

Carrier tape packaging systems are known in the prior art. Existing carrier tape packaging systems typically comprise an elongated, double sided and flexible carrier tape made of paper or plastic with a multiplicity of punched cavities utilized for retaining small electronic components, typically surface mount devices known as SMDs. Generally, heat sealed cover tapes, one on each side of the punched carrier tape, are used to retain components within the cavities.

Another existing system for retaining small components within the carrier tape is to use an embossed plastic carrier, a.k.a. blister tape. Small tub-like cavities are thermoformed into a strip of plastic. Small components are placed into the cavities, and the cavities are covered with a heat sealed cover tape. The heat sealed cover tape encloses the cavities which contain the small components. Carrier tapes which include these thermoformed cavities are known as embossed carrier tapes or blister tapes.

The inherent characteristics of both punched and embossed conventional carrier tapes provide that the small components are loose in the punched or embossed cavity. While they are retained within the recess of the cavity, the small components can move in all directions (x, y and theta). When the top cover tape is removed by peel back, vibrations are induced which can cause the small components to move out of their required orientation or jump out of the cavity. In addition, very small components can and will adhere to the cover tape because of static electric charge buildups generated during cover tape peel back and thereby not be available for automatic retrieval from their pockets. In addition, these static electric charges, however slight, can damage or destroy active electronic components through electro-static discharge (ESD).

A classic problem with conventional carrier tapes is that the peel-back of cover tape creates adverse vibrations on the carrier tape. These vibrations are particularly troublesome with extremely small, lightweight components, the position of which can be disturbed by these vibrations. Another problem is that it is impossible to heat seal the carrier tapes with total uniformity. This irregular seal causes 'spikes' during peel back which result in vibration and component disorientation. Force vibrations of as little as 0.05 newton have been known to cause components to jump out of their cavities or assume positions whereby retrieval using vacuum probe nozzles is not possible. In addition, when the cover tape is peeled back, it is possible that the small component could be vibrated or pulled out of the aperture or out of its orientation. Still another problem with the cover tape is that static charges can build up on the cover tape and during the peel back they can be released as a sudden flood of charges applied to an individual small active component or to several of the small components which are highly susceptible to electrostatic discharge. Electrostatic discharge applied to small components such as integrated circuits can cause reliability concerns and catastrophic failure.

Another existing means for housing the small components is to use a punched paper carrier tape, as opposed to a plastic, both used in conjunction with top and bottom cover tapes. In addition to the problems discussed above resulting from the usage of cover tape, the paper carrier tape creates problems due to dust and paper particles which are generated when the cover tape is pulled off the carrier tape surface. In addition, the paper carrier tape can delaminate when the top cover tape is pulled off, resulting in sudden separation of a length of cover tape from the carrier with subsequent component spillage.

In another existing system, the carrier tape has a multiplicity of apertures and has a single length of pressure sensitive tape at the bottom and no cover tape. Small components are individually placed into the aperture of the carrier tape on the adhesive. When the components are removed from the adhesive surface, a vacuum tip is usually employed to remove and carry the component. Excessive adhesive strength in the component to adhesive bond can make separation of the component from the adhesive surface difficult. A poke-up needle is sometimes used to release the component from the adhesive in coordination with the action of the vacuum tip. It is often awkward to use the poke-up needles to release the small components because components and they sometimes exert unbalanced mechanical force to the small component as they push through the adhesive bottom. In addition, adhesive may adhere to the IC or other small component after it is removed from the carrier tape and the adhered adhesive causes problems when the component is placed on a printed circuit board or other mounting surface. Finally, with a film backing of pressure sensitive tape to contend with, a poke-up needle encounters considerable resistance as it tries to penetrate the adhesive and push the IC or other small component out of the carrier tape. Fine pointed needles are required to penetrate the film backing of the pressure sensitive tape; these fine points expose components to physical damage, and frequently break during repeated use, resulting in production downtime and increased probability of adhesive retention on the component.

Instead of using an aperture with a closed bottom surface, the present invention uses at least two split PSA tape stratums, instead of one, on the bottom side o the embossed carrier tape. Adjusting the gap between the two PSA tape stratums provides precise adjustment of the firmness of the adhesion between the small component and the two PSA tape stratums. The usage of multiple PSA tape stratums in small component carrier tape packaging systems provides two major advantages. First, it provides a fine adjustment of the amount of adhesive exposed to the component to achieve adhesive bond and second, it provides clearance for the poke-up needles if poke-up needles are utilized.

In many existing automated handling processes, carrier tape packaging systems are used for retaining a multiplicity of small, light and fragile electronic, mechanical or other types of components, such as integrated circuit (IC) chips. A carrier tape packaging system typically comprises an elongated, double sided and flexible carrier tape having a thickness at least equal to and preferably greater than the thickness of the small components. The elongated carrier tape comprises a multiplicity of apertures along its length for accommodating a multiplicity of small, light and fragile components. An elongated flexible thin PSA tape stratum is adhered to one side of the double sided carrier tape, such that each one of the multiplicity of apertures of the embossed carrier tape has a closed adhesive bottom constituted by a portion of the elongated PSA tape stratum. Therefore each of the multiplicity of small components can be securely retained within one of the multiplicity of apertures respectively.

A small component is subsequently released from its aperture and adhesive surface for further assembly. To remove the small components from the adhesive surface of the aperture, a vacuum tip is usually employed to remove and carry the component. Excessive adhesive strength in the component to adhesive surface bond makes separation of the component from the adhesive surface difficult and the separation is often physically stressful to the small component. Residue adhesive on the component creates further problems when the component is placed on a printed circuit board.

One common method of releasing the multiplicity of small components from the elongated carrier tape is to use reciprocating or "poke-up" needles. To remove a small component from the elongated carrier tape, a poke-up needle is positioned underneath the PSA tape stratum and aligned with the aperture containing the small component. The poke-up needle action is performed synchronously with the action of the vacuum tip. While the vacuum tip is in intimate contact with the surface of the small component, the upward movement of the poke-up needle can force the small component away from the PSA tape stratum and into the exclusive possession of the vacuum tip for carrying to subsequent assembly processing.

One problem with the conventional carrier tape having PSA tape over the bottom of the carrier aperture is that it is not very effective to use the poke needles to release the small components because the poke-up needles cannot directly engage with the small components. Instead of directly engaging, the poke-up needles poke through the PSA tape stratum, and the strength of the PSA tape stratum somewhat negates the poke-up forces. This awkward set of forces on the small component can have consequences which disrupt the normal flow of manufacturing. Unless a wide range of pressure sensitive tapes with varied adhesive characteristics is employed, it is impossible to adjust the adhesiveness of the PSA tape stratum to be strong enough to hold the small components securely, yet not excessively which would make removal of the small components difficult. The absence of control over the forces needed to remove the small component from the PSA tape stratum contribute to the overall stress which is imposed on the small component and often result in failure to retrieve components from the tape for automatic placement—a condition which seriously reduces machine throughputs and increases need for assembly rework.

The novel feature of the present invention is to use two split PSA tape stratums, instead of one, on the bottom side of the embossed carrier tape. A very precise gap is maintained between the two split PSA stratums along the centers of the multiplicity of apertures of the carrier tape. This very precise gap serves two purposes: first, it provides an accurate means for adjusting how firmly the small components are attached to the PSA tape stratum, and second, it provides a clearance for the poke-up needles to directly engage the small components.

When a small component is retained within an aperture, it is adhered to the two split PSA tape stratums. A portion of the bottom surface of the small components is not adhered to either PSA tape stratums because of the gap between the two PSA tape stratums. Adjusting the gap between the two PSA tape stratums provides precise adjustment of the firmness of the adhesion between the small component and the two PSA tape stratums.

Multiple PSA tape stratums provide the capability of a micrometer-like adjustment of the adhesive strength of the small component to PSA tape bond. In varying the surface area exposed to the small component by adjusting the gap width between the two tapes, removal of the small component is thereby made more controlled with improved reliability in automated component retrieval and placement. By adjusting the gap distance of the tape, the surface area of the tape overlying the small component is thereby controlled, resulting in a micrometer-like adjustment of the adhesive suitable for high speed automated processing.

The adhesive strength of the tape-to-component bond is constrained by two extremes. The adhesive strength should be at least as great as that which is required to hold the small component in place securely while the component is moving during processing and the adhesive strength should be less than that which could impede or prevent removal of the small component during high speed automated processing.

Another significant benefit of utilizing multiple PSA tape stratums in conjunction with carrier tape, is that the gap region spacing between the PSA tapes provide clearance for the poke-up needles, when the poke-up needles are used to assist removal of the small component, thereby avoiding: the force needed by the poke-up needle to protrude through a solid PSA tape bottom; and the possibility of the retention of any adhesive on the removed component. The clearance for the poke-up needle, provided by the two PSA tapes, will be present even if the gap between the two tapes is set to zero. It is particularly significant that a blunt or flat pointed poke-up needle may be employed because of gap spacing between the PSA tapes. When a heretofore single strand of PSA tape has been utilized, the point of the poke-up needle must be sharp in order to penetrate the film backing of the PSA tape. Sharp points on poke-up needles break off frequently during usage, resulting in production downtime for replacement and increased probability of transfer of adhesive residue to components when broken point poke-up needles are unnoticed and not replaced.

The following twelve patents are the closest prior art of which the inventor is aware.

1. U.S. Pat. No. 3,881,245 issued to Dudley et al. (hereafter the "Dudley Patent") on May 6, 1975 for "Mounting Electrical Components on Thick Film Printed Circuit Elements".

2. U.S. Pat. No. 4,575,995 issued to Tabuchi et al. (hereafter the "Tabuchi Patent") on Mar. 18, 1986 for "Automatic Producing Apparatus of Chip-Form Electronic Parts Aggregate".

3. U.S. Pat. No. 2,885,849 issued to Wohlman, Jr. (hereafter the "Wohlman Patent") on May 12, 1959 for "Semiconductor Taping Apparatus".

4. U.S. Pat. No. 3,177,629 issued to Anspach (hereafter the "Anspach Patent") on Apr. 13, 1965 for "Apparatus for Loading Components".

5. U.S. Pat. No. 4,340,774 issued to Nilsson et al. (hereafter the "Nilsson Patent") on Jul. 20, 1982 for "Device for Mounting Circuit Components on a Circuit Board".

6. U.S. Pat. No. 3,691,436 issued to Maijers et al. (hereafter the "Maijers Patent") on Sept. 12, 1972 for "Electrical Circuit Element having a Diagonal Abutment Strip and Method of Manufacturing the Same".

7. U.S. Pat. No. 3,971,193 issued to Tardiff et al. (hereafter the "Tardiff Patent") on Jul. 27, 1976 for "Machines for Sequencing Diverse Components".

8. U.S. Pat. No. 4,724,954 issued to Sillner (hereafter the "Sillner Patent") on Feb. 16, 1988 for "System for Conveying and Guiding Components, in Particular Electrical Construction Elements Which are Held on a Belt in a Radially or Quasi-Radially Belted Manner".

9. U.S. Pat. No. 4,954,207 issued Higuchi et al. (hereafter the "Higuchi Patent") on Sep. 4, 1990 for "Apparatus for Automatically Taping Electronic Components".

10. U.S. Pat. No. 3,608,711 issued to Wiesler et al. (hereafter the "First Wiesler Patent") on Sept. 28, 1971 for "Package for Electronic Devices and the Like".

11. U.S. Pat. No. 3,785,507 issued to Wiesler et al. (hereafter the "Second Wiesler Patent") on Sept. 28, 1971 for "Die Sorting System".

12. U.S. Pat. No. 4,298,120 issued to Kaneko (hereafter the "Kaneko Patent") on Nov. 3, 1981 for "Chip-Like Electronic Component Series and Method for Supplying Chip-Like Electronic Components".

The first wiesler patent discloses a package for electronic devices and the like, which utilizes a tape 12 with a plurality of openings 14 in the tape 12 to receive a device 10. The device 10 is held in place by an adhesive tape, applied from the back, which is exposed at the opening and serves as a tape stratum 16 for holding the device 10 in place.

In contrast, the present invention is a combination of a carrier tape with apertures, used with a double PSA tape, set onto the underneath surface of the carrier tape, so that the device can be placed onto the two surfaces of tape. The gap between the two surfaces of tape can be set with a micrometer type accuracy so the device can be easily extracted from this arrangement. The gap provides a clearance for the poke-up needle which pushes the device out of the tape arrangement so it may be handled by the vacuum tip of a pick and place machine.

The Tabuchi patent discloses an automatic producing apparatus of chip-form electronic parts aggregate. In FIG. 4 of the Tabuchi patent, there is a tape-like housing body formed by the automatic producing apparatus of the Tabuchi disclosure. The tape-like housing body has a feed hole along the side and a frame type housing hole with a specific pitch between the housing holes.

In the Tabuchi patent, there is once again a tape covering which essentially covers the entire portion of the carrying tape which thereby introduces all of the problems that have been addressed in the prior art. In the present invention this is overcome by a set of two tapes which have variably set gap distances to facilitate efficient retention of the small components and adjustable adhesive strength of the tapes. In utilizing the multiple PSA tape stratums, the small components are affixed in such a way that provides clearance for the poke-up needles so the small component can be easily removed and by permitting the gap width between the tapes to be adjustable, the strength of the tape to component bond can, in such a manner, be finely controlled.

The second Wiesler patent discloses a die sorting system which uses a strip 140 comprised of a relatively narrow strip formed with indexing holes 142 along one edge, and storage holes 144 near the outer edge of the strip. On the bottom side, a thin pressure sensitive adhesive tape 146 is laminated to the strip 140 and provides an adhesive floor, to hold the die 100, at the bottom of the storage holes.

The Kaneko patent discloses a chip-like electronic component series and method for supplying chip-like electronic components, comprising a tape-like member formed with a plurality of apertures with upper and lower cover sheets that contain small chip-like electronic components. FIGS. 19 and 20 illustrate the upper tape 72 and lower tape 74 relation to the receiving concavity 70.

The Anspach patent discloses an apparatus for loading components. These components are primarily larger components than what the present invention envisions and are primarily leaded diodes. The present invention is intended for use primarily with leadless electronic components or surface-mounted devices (SMDs). Referring to FIG. 5, there is a gap in the carrier where the heads of the transistors are placed but the transistors themselves are carried by having the lead sandwiched between the carrier tape and an adhesive tape.

The Higuchi patent discloses an apparatus for automatically taping electronic components. The electronic pitch and an adhesive tape is applied to fix the electronic components in position. One of the main points of the Higuchi patent is that the electronic component is placed on an elongated first tape and by applying a second tape, the component is fixed between the two tapes.

The Dudley patent discloses a device for mounting electrical components on thick film printed circuit elements. Two metal strips 15 and 16 are attached to printed areas 14, adhered by electrical resistance welding for contacting electrodes.

The Wohlman patent discloses a semiconductor taping apparatus. The semiconductors are taped at lateral ends by a pair of tapes 73, and another pair of tapes 74 where the adhesives in tapes 73 face the adhesive side of the tapes in the second pair of tapes 74.

The Nilsson patent discloses a device for mounting circuit components on a circuit board which include apertures in the plate designed to hold by means of a friction fit.

The Maijers patent discloses an electrical circuit element having a diagonal abutment strip and method of manufacturing the same. In the Maijers patent, small discrete components are interconnected by means of a strip of tape.

The Tardiff patent discloses machines for sequencing diverse components. In the Tardiff patent, small electrical components are sequenced and interconnected with tape at opposite ends of their lead portions.

The Sillner patent discloses a system for conveying and guiding components, in particular electrical construction elements which are held on a belt in a radially or quasi radially belted manner. The components in the Sillner patent are also held by tape at the ends of their leads.

Therefore, none of the prior art have combined the concept of having an invention which utilizes multiple PSA tape stratums as an integral part of a small component packaging system, which: provides a micrometer-like adjustment of the adhesive strength of the small component to PSA tape by adjusting the gap width between the tapes, facilitating removal and further processing; and provides a clearance so the poke-up needles can push up through the gap of the tapes, thereby assisting in the removal of the small component from the carrier tape and PSA tape arrangement.

SUMMARY OF THE PRESENT INVENTION

The present invention utilizes multiple PSA tape stratums in conjunction with a carrier tape to retain small components for automated assembly processing.

The carrier tape, in the present invention, comprises a multiplicity of small carrier tape aperture cavities where each small carrier tape aperture cavity is designated to contain a range of small component sizes of varied geometries within a total maximum envelope. The small carrier tape aperture cavity of the carrier tape defines an aperture cavity in the tape which has a boundary of the same general outline as the small component, although the aperture cavity may be substantially larger to allow the component to be easily fit within the aperture cavity. The carrier tape aperture cavity is designed such that the small component is completely surrounded by the carrier tape boundary squarely about the side periphery of the small component. The thickness of the carrier tape and the resulting depth of the aperture easily may be at least as deep as, or slightly deeper than the height or thickness of the small component. In other circumstances, depending upon the type and style of component and the characteristics of the automatic handling equipment with which the carrier tape will be utilized, the carrier tape thickness and resulting aperture cavity depth may be substantially less than the height or thickness of the small component. By placing the small component into the carrier tape aperture cavity of the carrier tape, where the carrier tape aperture cavity bounds the small component about the sides, the pressure sensitive adhesive (PSA) tape supports the base of the small component and the position and orientation of the small component is therefore fixed with respect to the carrier tape. Accurately fixing the position of the small component with respect to the carrier tape is an important consideration for subsequent automated handling in systems manufacturing.

The PSA tape is a pressure sensitive adhesive tape which retains the small component. The small components are retained by the PSA tape adhesive in the carrier tape aperture cavity of the carrier. The carrier tape is used as a mounting matrix for the PSA tape.

In the present invention, at least two pieces of PSA tape are used, overlaying the carrier tape and a portion of the carrier tape aperture cavities, longitudinally, along the length of the carrier tape. In this manner, the carrier tape and PSA tape arrangement are prepared as a nest or aperture cavity for the small component where the PSA tape supports the small component at the base. Prior to placing the small component into the aperture cavity, the aperture cavity is open at the top and the PSA tape is partially exposed through the carrier tape aperture cavity, with the adhesive side upward. The small component is then placed into the aperture cavity. The small component is supported at its base from underneath by the two pieces of PSA tape.

Therefore, by applying two or more layers of PSA tape stratum to the back surface of the carrier tape with carrier tape aperture cavities, the adhesive side of the PSA tape partially exposed through the carrier tape aperture cavities can cover a variable surface area of the small component. Since the adhesive strength of the tape-to-component bond is determined by the amount of tape which is in direct contact with the small component, the adhesive strength of the tape to-component bond can be adjusted to a desired criterion.

It is very important to control the tape-to-component bond strength. Ideally, the tape-to-component bond strength would allow a vacuum tip to be placed over the small component which is packaged in the carrier tape aperture and PSA tape arrangement of the present invention, the vacuum tip would pull vacuum, and the component would be grasped by the vacuum tip and allow itself to be pulled out of the aperture cavity into the exclusive possession of the vacuum tip with no change in orientation from the positioning of the small component in the aperture cavity. Any excessive resistance of the small component, or reluctance to be pulled out of its aperture cavity, can result in a misalignment of the component with respect to the vacuum tip or failure to pick up the component using the vacuum tip. Correct alignment is extremely critical, especially when handling very small components.

In integrated circuit type small components, the die size (top surface outline with respect to the small component's position in the carrier tape) rectangular dimensions can be less than $40 \times 20$ mils (where one mil is one thousandth of an inch). The thickness of the small components can be less than 5 or 6 mils. The planarity of the front and back surfaces of these small components is usually very precise and the orientation of the small component, with respect to the vacuum tip which clutches the small component after its release from the aperture cavity, is very important for the correct subsequent positioning by the vacuum tip. These small components are delicate.

Therefore, if the tape-to-component bond strength is excessive, uneven or irregular, the potential negative impact to successful manufacturing of the small component is: first, a twisting or change in orientation for the small component with respect to the vacuum tip which picks up the small component out of the aperture cavity; second, a translation error by the vacuum tip which shifts the center position of the vacuum tip with respect to the small component; third, a complete failure by the vacuum tip to pick the small component out of the aperture cavity; and fourth, a disturbance to the overall structural integrity of the small component.

Another advantage to utilizing two pieces of PSA tape to hold the small component at the base is also the gap space which is between the two pieces of tape. The gap space is a very important feature of the present invention, because a poke-up needle is often used to push the component out of the aperture cavity. When a solid piece of PSA tape is used to secure the small component, the poke-up needle has to overcome the cohesive forces at the surface of the solid PSA tape and penetrate the PSA tape backing (typically a polyester film) in order to protrude through the tape. However, in the present invention, the gap space between the two tapes provides a clearance for the poke-up needle to assist the small component out of the aperture cavity even if the gap between the two tapes is set to zero.

While the poke-up needle is used to assist in the removal of the small component from the aperture cavity, the primary removal of the small component from the aperture cavity is accomplished by means of the vacuum tip of a pick and place machine. The vacuum tip, through suction, picks the small component out of the aperture cavity where it is adhesively held by the PSA tape. In the past, when a solid PSA tape bottom to the aperture cavity was used, the adhesive strength of the component-to-tape bond was usually too great for the vacuum tip to pull the small component out of the aperture cavity. The poke-up needle was implemented, as an assist, to overcome the adhesive strength of the component-to-tape bond. In pushing through the solid PSA tape bottom, the poke-up needle forces, in conjunction with the forces due to the adhesive strength of the component-to-tape bond, create a set of unbalanced forces on the component resulting in the increased probability of a misplacement and loss of orientation which could shut down the manufacturing process until the system is put back into alignment. In addition, the poke-up needle which was required to push through the PSA tape often resulted in small pieces of tape affixed to the otherwise smooth planar surfaces of the small component which was undergoing processing, and this adhered tape can cause additional problems at subsequent steps of processing.

In the present invention, the adhesive strength of the tape-to component bond is more efficiently controlled by using the two pieces of PSA tape, with a gap spacing between them adjusted so the adhesiveness of the tape-to-component bond could be finely tuned based on empirical data derived from statistical process control studies or other observations.

It may, or may not be necessary to use the poke-up needle to assist the small component out of the aperture cavity. As stated earlier, the poke-up needle is used as an assist when the adhesive strength is too great. However, in instances where it is appropriate to use the poke-up needle, the small component can be pushed out of the aperture cavity directly, through the gap spacing between the two pieces of PSA tape. This benefit is significant even when the gap between the tapes is set to zero, because it would no longer be necessary to push the poke-up needle through the PSA tape which has, in the past, resulted in the previously stated problems. Even with the gap set at zero, the poke-up needle can penetrate between the two sections of PSA tape and does not have to overcome a resistance force of solid tape.

It has been discovered, according to the present invention, that multiple PSA tape stratums and carrier tape arrangement can secure small components in a carrier tape aperture cavity and have the capability of providing a micrometer-like adjustment of the adhesive strength of the tape-to-component bond.

It has been additionally discovered, according to the to the small component by adjusting the gap width of the multiple tapes, removal of the small component is more efficiently controlled due to a reduced variation of mechanical stresses to the small component which could impede or prevent removal of the small component during high speed automated processing.

It has been further discovered, according to the present invention, that in utilizing multiple PSA tape stratums in conjunction with punched carrier tape, the gap region spacing defined by the region between the PSA tapes provide clearance for the poke-up needles, when the poke-up needles are used to assist removal of the small component, thereby avoiding misplacement in handling or retention of any adhesive on the removed component and subsequent disorientation when the removed part is placed on a planar mounting surface.

It has also been discovered, according to the present invention, that an aperture cavity of maximum size can be employed to retain a range of component sizes. Heretofore, aperture cavities in both punched and embossed carriers employing host-sealed cover tapes were required to be specifically sized to provide an accurate fit to components being placed within these aperture cavities. This requirement for specific sizing is manifest because the side walls of each aperture cavity are the only means which serve to restrict x, y and theta movement of the component which is loose and free to move within the aperture cavity. However, use of multiple PSA stratums to secure components within carrier tape aperture cavities negates the need for the walls of the aperture cavity to serve as means for component orientation. In practice, the component placed on the multiple PSA stratums never contacts the sidewall of the aperture cavity, resulting in two principal benefits: (1) a single aperture cavity size can be used for multiple component sizes, resulting in standardization and reduction in total variety and costs of carrier tapes needed for a range of component sizes; (2) The additional size of the overall aperture cavity permits ready access of a vacuum probe of required size to pick up the component which may be below the top surface of the cavity in the carrier tape.

It is therefore an object of the present invention, to provide a multiple PSA tape stratum and carrier tape arrangement to secure small components in a carrier tape aperture cavity which has the capability of providing a micrometer-like adjustment of the adhesive strength of the tape-to-component bond.

It is an additional object of the present invention to vary the surface area of adhesive exposed to the small component by adjusting the gap width of the two tapes, thereby providing a more controlled removal of the small component from the carrier tape aperture cavity which results in a reduced variation of mechanical stresses to the small component which could impede or prevent removal of the small component during high speed automated processing.

It is a further object of the present invention to provide multiple PSA tape stratums in conjunction with a carrier tape, so that the gap spacing defined by the region between the PSA tapes provides clearance for poke-up needles, when the poke-up needles are used to assist removal of the small component, thereby avoiding misplacement in handling or retention of any adhesive on the removed component and subsequent disorientation when the removed part is placed on a planar mounting surface.

In the present embodiment, the procedure for packaging the small component using the carrier tape and PSA tape stratums is as follows. The preferred type of carrier tape used is plastic carrier tape. The carrier tape is prepared with carrier tape aperture cavities which are large enough to contain a range of small component sizes consistent with cavity pitch. The PSA tape is affixed to the carrier tape from the lower or inferior side of the carrier tape and the two PSA tapes are aligned longitudinally parallel and laterally separated at a gap set according to the desired adhesive strength. The PSA tape will extend across the small component and carrier tape. The small component is then placed into the carrier tape aperture cavity region from a point above or superior to the aperture cavity, firmly seating the small component into the aperture cavity which is partially bounded at the inferior surface of the carrier tape by the PSA tape stratum with the adhesive facing upward to retain the small component. After the small component is placed into the carrier tape aperture cavity, the small component is in position for further processing. In subsequent processing, the component is extracted from the carrier tape aperture cavity by means of a pick and place machine vacuum tip. If the small component is especially difficult to remove from the aperture cavity, the assistance of the poke-up needle, to push the small component away from the adhesive of the PSA tapes may be employed. The gap spacing created by the two PSA tapes allows the poke-up needle to push directly against the small component.

It is a further object of the present invention, that an aperture cavity of maximum size can be employed to retain a range of component sizes. Heretofore, aperture cavities in both punched and embossed carriers employing host-sealed cover tapes were required to be specifically sized to provide an accurate fit to components being placed within these aperture cavities. This requirement for specific sizing is manifest because the side walls of each aperture cavity are the only means which serve to restrict x, y and theta movement of the component which is loose and free to move within the aperture cavity. However, use of multiple aperture cavities negates the need for the walls of the aperture cavity to serve as means for component orientation. In practice, the component placed on the multiple PSA stratums never contacts the sidewall of the aperture cavity, resulting in two principal benefits: (1) a single aperture cavity size can be used for multiple component sizes, resulting in standardization and reduction in total variety and costs of carrier tapes needed for a range of component sizes; (2) The additional size of the overall aperture cavity permits ready access of a vacuum probe of required size to pick up the component which may be below the top surface of the cavity in the carrier tape.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Figure 1:
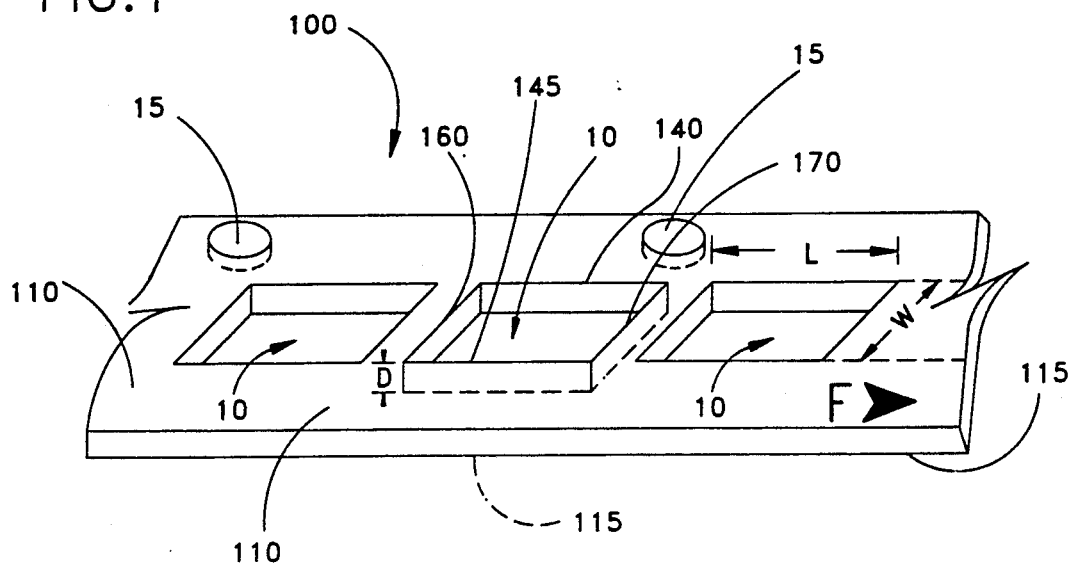
FIG. 1 is a perspective view of the carrier tape stratum with a plurality of carrier tape aperture cavities.

Referring to FIG. 1, there is shown a perspective view of the carrier tape 100, with a plurality of carrier tape aperture cavities 10. The carrier tape 100 is a smooth ribbon like film, usually made of plastic. The carrier tape 100 has a plurality of carrier tape aperture cavities 10 which form a hexahedron volume region. The length L, width W and depth D of an individual carrier tape aperture cavity 10 is generally dependent on the pitch of the aperture cavity to the sprocket drive holes 15 as well as the nature and thickness of the component to be placed within the aperture cavity. The hexahedron volume region of the carrier tape aperture cavity 10 can have dimensions of less than forty mils in length, by twenty mils in width, by five mils in depth (where one mil is a thousandth of an inch). Some of the normal ranges for the carrier tape 100 thickness D and resulting aperture cavity depth is of the order of five or six mils at a shallow depth, and sixty or seventy mils for the thicker cavity material. The thickness D of the carrier tape 100 may be greater than the thickness of the small component which is to be retained, or thickness D of the carrier tape may be substantially less than the thickness of the component to be retained, thereby allowing the retained component to protrude above the surface of carrier tape 100.

The carrier tape 100 is used in high speed manufacturing processes, where a continuous reel of small components are retained in the carrier tape aperture cavities 10 and are sequentially indexed to a specific position or dead spot by the processing machinery. In order to feed the carrier tape 100 forward, accurately indexing the carrier tape 100 forward an exact distance, the carrier tape has sprocket drive holes 15 which engage the gear teeth of a drive wheel or the probe of a lateral pawl of the processing machinery (typically, a tape feeder) and synchronizes the translation of the carrier tape 100 with the action of other processing machinery such as the vacuum tip arm of a pick and place machine. The direction of forward feed F, designated by an arrow at forward feed F, is the direction which the carrier tape 100 moves during processing.

The carrier tape aperture cavity 10 of the carrier tape 100 is typically a vacant hexahedron region which has four enclosed sides. The four enclosed sides are: the left lateral side 140 and the right lateral side 145 which are lateral to the direction of forward feed F; a leading side 170 which is in the direction of forward feed F; and a trailing side 160 opposite to the direction of forward feed F. However, the geometry of the aperture cavity could assume any convenient shape suitable for component retention, such as round, or oval, for example.

The carrier tape has an upper surface 110 and a lower surface 115. The carrier tape thickness is the same as the depth D of the carrier tape aperture cavity 10.

Figure 2:
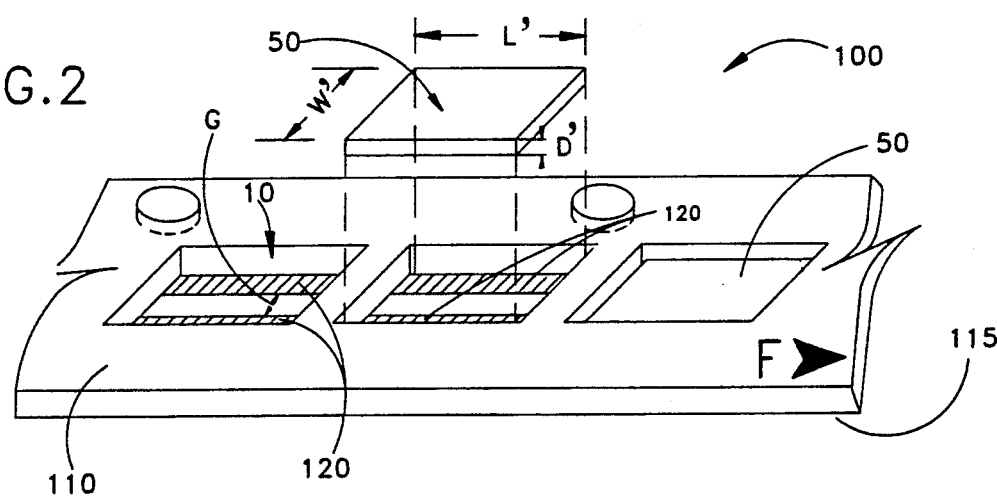
FIG. 2 is a top perspective view of the carrier tape, the carrier tape aperture cavities, the PSA tape stratum and the small components which fits into the carrier tape aperture cavities.

Referring to FIG. 2, at the central carrier tape aperture cavity 10 illustrated, a small component 50 is shown which fits to the inside of the carrier tape aperture cavity 10. Looking into the carrier tape aperture cavity 10, the adhesive side of two pieces of PSA tape stratum 120 is shown. The adhesive side of two pieces of PSA tape stratum 120 will secure the small component 50, shown suspended at a point superior to the carrier tape upper susurface 110 of the carrier tape aperture cavity 10 as defined in FIG. 1.

Referring again to FIG. 2, to the right of the central carrier tape aperture cavity 10, there is another carrier tape aperture cavity 10 which has a small component seated in the cavity.

When the small component 50 is placed into the carrier tape aperture cavity 10, the small component 50 is supported at the bottom of the carrier tape aperture cavity 10 by the two pieces of PSA tape stratum 120. The small component 50 as shown has a width W+, a length L+, and a depth D'; however, the component may assume any shape independent of the shape of the cavity, such as round or oval, by way of example.

Figure 8:
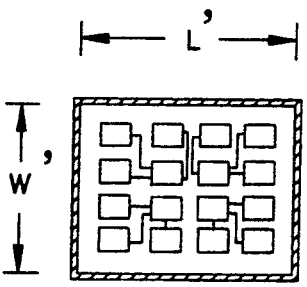
FIG. 8 is a top plan view of a typical IC component used with the present invention.
Figure 9:
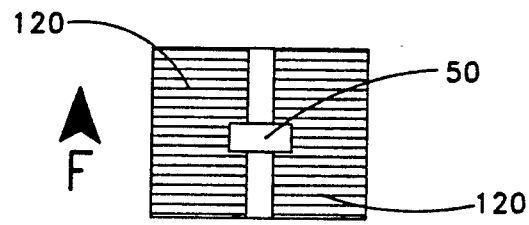
FIG. 9 is a top plan view of a typical tiny component centered within an aperture cavity much lager than the component contained, with said cavity intended to accommodate a range of small component sizes.

Small components commonly stored in this manner are integrated circuit dice (note: the plural of die is dice), illustrated in FIG. 8 or tiny chip components, illustrated in FIG. 9. Integrated circuits often have a thin layer of metal bond pad region which are at the upper surface when the die is ready for packaging. Small disturbances to the surface of the integrated circuit or mechanical stress imperfections due to processing can negatively impact the quality and the functionality of the fully packaged integrated circuit.

Dimensions of integrated circuit dice can be as small (or even smaller) than 20 by 40 mils (where one mil is one thousandth of an inch) and less than 5 mils in depth. Integrated circuits are commonly stored and processed in the carrier tape 100 and PSA tape stratum 120 arrangement. In situations where the integrated circuits are fairly large, a vacuum nozzle pick and place machine is used to pick the small component out of the carrier tape aperture cavity 10.

When the components are particularly small, such as those 20 by 40 mils, the vacuum nozzle alone is often ineffective at picking the small component out of the carrier tape aperture cavity 10. In this circumstance, components are released from their affixed position with the assistance of a poke-up needle which is synchronized with the vacuum tip of the pick and place machine. One of the salient features of the present invention is the clearance for the poke-up needle which is provided by the gap spacing G of the multiple PSA tapes 120.

Figure 3:
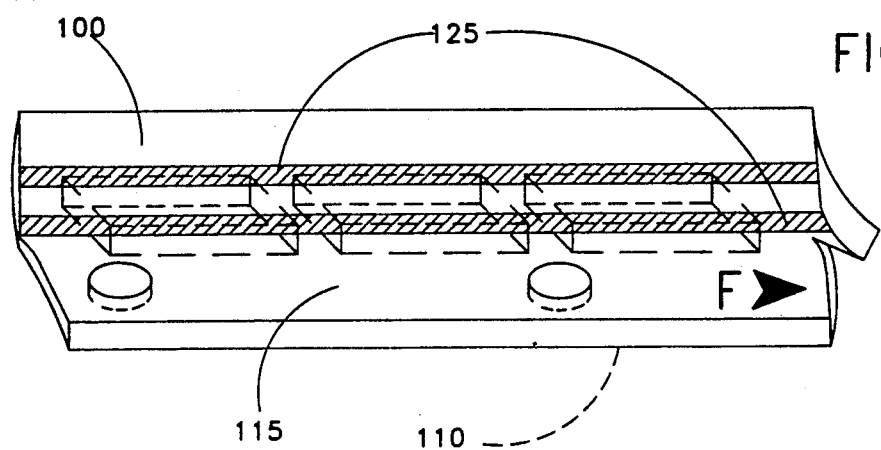
FIG. 3 is a bottom perspective view of FIG. 2, showing the PSA tape stratum partially covering the carrier tape aperture cavities of the carrier tape.

Referring to FIG. 3, the carrier tape lower surface 115, is shown in a perspective view of the underside of the carrier tape 100. The adhesive side 120 of the PSA tape stratum 125 shown, is applied to the lower surface 115 of the carrier tape 100 and partially overlapping the carrier tape aperture cavity 10. It can be seen that the carrier tape lower surface 115 is used as a mounting surface for the adhesive side 120 of the PSA tape stratum 125, and overlies the window aperture 10 of the carrier tape 100. The two PSA tape stratums 125 are aligned parallel to each other and are spaced apart by a gap which runs from zero to almost the entire width W of aperture 10, depending on the amount of embossed adhesive area desired to affix the small component 50.

Figure 4:
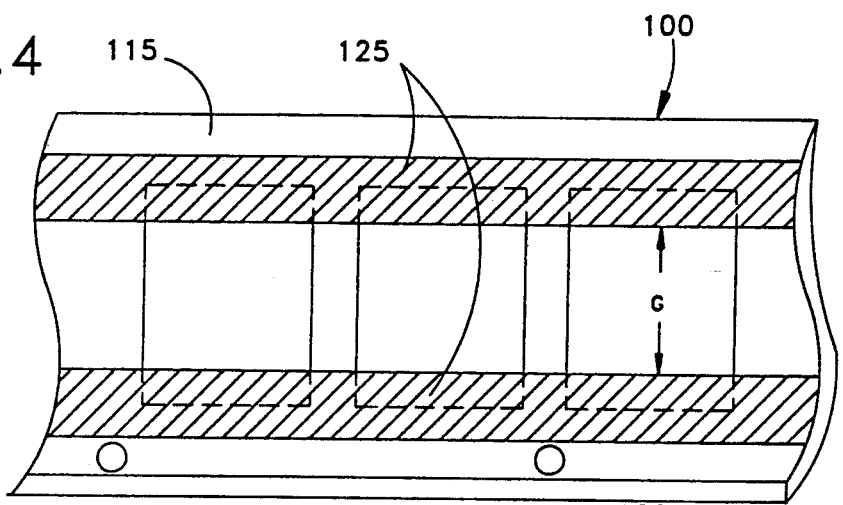
FIG. 4 is a bottom plan view of the carrier tape and carrier tape aperture cavities with the PSA tape stratum placed longitudinally along the length of the carrier tape.

Referring to FIG. 4, a bottom plan view of the lower surface 115 is shown with the PSA tape stratum 125 applied, overlapping the window aperture 10 of the carrier tape 100. A gap spacing G between the two PSA tape stratums 125 is shown. The gap spacing G between the two tapes is very important because, by adjusting the gap spacing G between the two tapes, the adhesive strength of the tape-to-component bond can be adjusted according to an adhesiveness goal. The gap spacing G should be set so the small component 50, FIG. 2, can be retained during movement or feed of the carrier tape 100 but should not be set to cause excessive adhesiveness which could impede or prevent removal of the small component 50 during high speed automated processing.

In practice, the there is no requirement that only two PSA tape stratums 125 should be transversely laid along the carrier tape 100 in a parallel manner. In fact, more than two or multiple PSA tape stratums could be used. A virtual webbing of PSA tape stratums may be a desirable arrangement under certain circumstances. The number of PSA tape stratums, and the manner in which the tapes are applied should depend on the particular small component 50 which is being packaged in the carrier tape 100.

In general, the procedure for packaging the small component 50 using the carrier tape 100 and PSA tape stratum 125 is as follows. The carrier tape 100 is prepared with window apertures 10 which are large enough to contain the small component 50. The PSA tape stratum 125 is affixed to the carrier tape 100 from the inferior side of the carrier tape 100 with the two PSA tapes 125 separated at a gap spacing G set according to the desired adhesive strength. The PSA tapes 125 will overlie the small component 50 and carrier tape 100 thereby affixing the small component 50 within the carrier tape aperture cavity 10. The small component 50 is then placed into the carrier tape aperture cavity 10 region from above the carrier tape aperture cavity 10, firmly seating the small component 50 into the carrier surface 115 by the PSA tape stratum 125 with the adhesive 120 facing upward.

After the small component 50 is placed into the carrier tape aperture cavity 10, the small component 50 is in position for further processing. Subsequently, the component will be extracted from the carrier tape aperture cavity 10 by means of the vacuum tip of a pick and place machine. If the small component 50 is especially difficult to remove from the carrier tape aperture cavity 10, the assistance of a poke-up needle, to push the small component 50 away from the adhesive 120 of the PSA tape stratums 125, may be employed.

The two PSA tapes 125 could have a gap spacing G of zero and there would still be an advantage to using multiple PSA tape stratums. The advantage would be that of allowing the poke-up needle to easily push through the PSA tape stratums from underneath the taped surface to assist in the release of the small component resulting in the avoidance of the disturbing force required to push through the cohesive surface of a solid tape surface. If the gap spacing G in the present invention were set to zero, the PSA tape 125 would be merely pushed aside to allow the poke-up needle to assist the component away from the adhesive surface 120 of the PSA tape 125.

Figure 5:
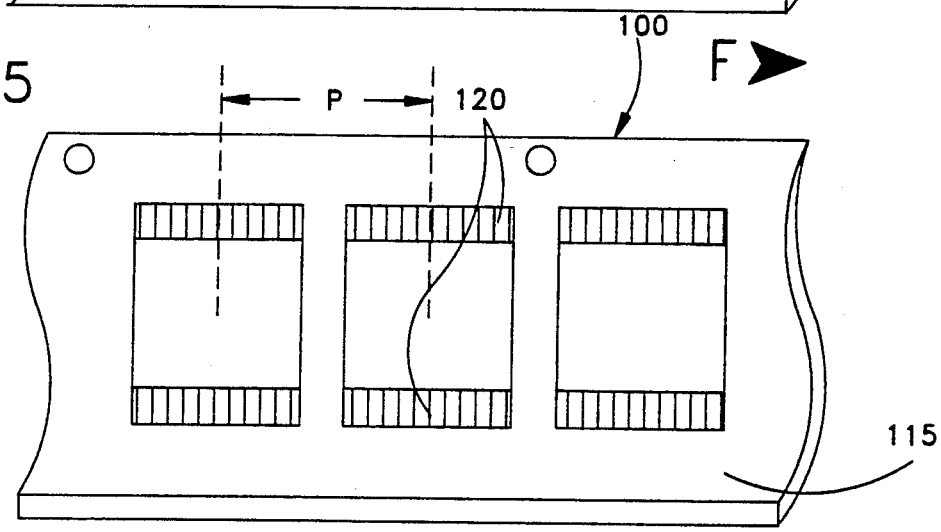
FIG. 5 is a top plan view of the carrier tape and carrier tape aperture cavities with the adhesive side of the PSA tape stratum exposed through the carrier tape aperture cavities.

Referring to FIG. 5, the longitudinal spacing from one carrier tape aperture cavity 10 to another carrier tape aperture cavity 10 is shown as the pitch P. The pitch P is set to adapt to the action of a carrier tape transport mechanism, typically a tape feeder used with a pick and place machine. In the top plan view of FIG. 5, the PSA tape stratum 125 is shown affixed to the carrier tape 100 with the adhesive side of the PSA tape stratum 125 facing upward, and is an arrangement to receive the small component 50 as shown in FIG. 2.

Figure 6:
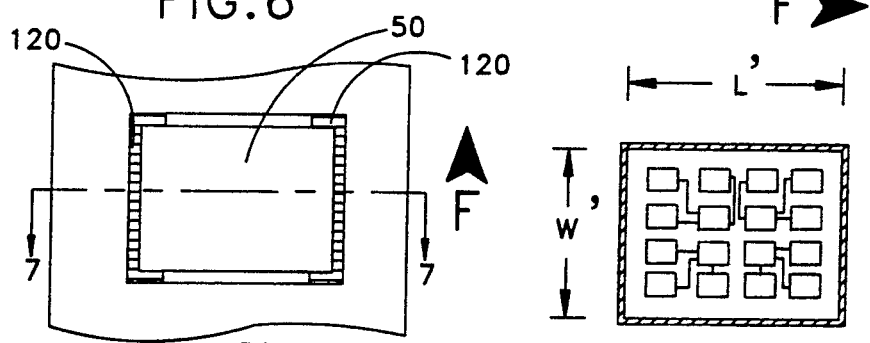
FIG. 6 is a top plan view of the carrier tape and carrier tape aperture cavity, with a small component seated on the PSA tape stratum in the aperture cavity.
Figure 7:
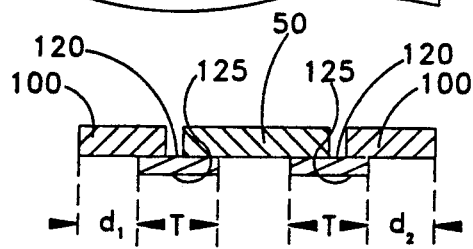
FIG. 7 is a side view of line 7-7 of FIG. 6 showing the small component seated on the PSA tape stratum within the aperture cavity.

Referring to FIG. 6 and FIG. 7, the small component 50 is shown seated in the carrier tape aperture cavity 10 with the two lengths of PSA tape 125 at the bottom of the carrier tape aperture cavity 10 The adhesive surface 120 of the PSA tape 125 comes in contact with the underside of the small component 50 and it can cover more or less of the surface area of the small component 50 depending on how closely the two lengths of PSA tape 125 are spaced together. The amount of small component 50 surface area which will be covered by the adhesive surface 120 of the PSA tape 125 is therefore determined by the gap spacing G between the two tapes.

Referring to FIG. 7, a side view of line 7—7 of FIG. 6 is shown, which illustrates the cross section of the small component 50 seated on the adhesive surface 120 of PSA tape 125 within the carrier tape aperture cavity 10, bounded at the lower side by two lengths of PSA tape stratum 125. The PSA tape 125 has a width T and a tape placement distance D1 and D2 away from each edge of the carrier tape lower surface 115. The width T of the PSA tape 125 and the tape placement distance D1 and D2 from the edge of the carrier tape lower surface 115 determines the component surface area which will be covered by the adhesive surface 120 of the PSA tape 125. Either by choosing various widths T of PSA tape 125 or by shifting the tape placement distance D1 and D2, or by a combination of both, the adhesive strength of the tape-to-component bond could be increased or decreased due to the change in the small component 50 surface area under adhesion.

Referring to FIG. 8, a top plan view of a typical small component 50 is shown. The integrated circuit has a width W' and a length L' and at the surface of the integrated circuit there are bonding pads exposed. The bonding pads are generally wired to connecting leads of the final package during later stages of processing. Excluding the bonding pads, the top surface of the integrated circuit is covered with a thin glass passivation layer. The thin glass passivation layer provides a limited protection to the internal device structures from mechanical damage. Therefore, the integrated circuit's susceptibility to mechanical stress should be a primary concern when processing.

Referring to FIG. 9, a top plan view of a typical tiny component 50 such as a chip resistor or chip capacitor is shown within an aperture cavity much larger in dimensions than the tiny component itself. Because components are placed upon lengths of PSA tape 125, the components are in a fixed position, unable to move in any direction (x, y, z or theta). The walls or sides of the aperture cavity do not serve to restrain movement of the component as is the case with conventional carrier tapes with heat sealed cover tapes. This condition provides two extremely important benefits: (1) The aperture cavity may be sized to accommodate a range of component sizes, permitting standardization and cost reduction in use of carrier tapes; (2) the large size aperture cavity affords ready access for vacuum pick up probes to enter the aperture cavity for optimum retrieval of the component, and without restriction by close in aperture cavity walls.

The present invention reduces the variation of mechanical stresses applied to the small component 50 by providing a more controlled manner of retaining and releasing the small component 50 within the carrier tape aperture cavity 10. Those who are skilled in the art of integrated circuit technology appreciate the reduction of manufacturing variance, at any stage of integrated circuit processing, because the overall reduction of variance leads to lower failure rates, higher overall yield, extended performance lifetimes and increased reliability of the fully packaged integrated circuit.

The present invention is not limited to usage with integrated circuits. Surface mount components in general and other small components could benefit from the implementation of multiple and split PSA stratums used in conjunction with the carrier tape for packaging.

The carrier tape can be wound on a reel from which it can be unwound for subsequent use.

Defined in detail, the present invention is a carrier tape and pressure sensitive adhesive (PSA) tape stratum means for receiving, retaining and releasing small components, comprising:

a. a carrier tape having a lower side and an upper side, and which is comprised of a plurality of hexahedron shaped carrier tape aperture cavities;

b. each hexahedron shaped carrier tape aperture cavity having a length, width and depth dimensions generally greater than the length, width and depth dimensions of the small component to be retained in the carrier tape aperture cavity of the carrier tape;

c. a pair of pressure sensitive adhesive (PSA) tapes which are affixed to the lower side of the carrier tape with their adhesive surfaces facing into the cavity while partially overlapping said aperture cavity of the carrier tape to partially bound the lower side of said cavity and provide an adhesive support for a small component to be retained in said cavity of the carrier tape;

d. an adjustable gap spacing between the PSA tapes to vary the surface area of the small component which is adhesively contacted by the two PSA tapes for the purpose of adjusting the adhesive strength of the tape-to-component bond; and e. a gap spacing clearance for poke-up needles between the two PSA tapes on the lower surface of the carrier tape, where the poke-up needles are used to push the component from a point below the small component seated in said cavity of the carrier tape, thereby assisting in the unobstructed removal of said small component.

Defined broadly, the present invention is a carrier tape and pressure sensitive adhesive (PSA) tape stratum means for receiving, retaining and releasing small components, comprising:

a. a carrier tape having a lower side and which is comprised of a plurality of carrier tape aperture cavities;

b. each carrier tape aperture cavity to accommodate at least a portion of the small component thereby retaining at least a portion of the small component in the carrier tape aperture cavity of the carrier tape;

c. a multiplicity of pressure sensitive adhesive (PSA) tapes which are affixed to the lower side of the carrier tape with their adhesive surfaces facing into the cavity while partially overlapping said cavities of the carrier tape to partially bound the lower side of said cavity and provide an adhesive support for a small component to be retained in said cavity of the carrier tape; and d. a gap spacing between the PSA tapes set to adhesively contact a surface area of the small component with an adhesive side of the PSA tapes thereby setting the adhesive strength of the tape-to-component bond.

Defined even more broadly, the present invention is a longitudinal carrier tape having a given thickness for housing small components for subsequent automated assembly comprising:

a. a multiplicity of longitudinally spaced apart apertures with each aperture extending through the entire thickness of said longitudinal carrier tape and having a given width;

b. said longitudinal carrier tape having an upper surface and a lower surface; and c. a pair of parallel lengths of pressure sensitive adhesive tape affixed to the lower surface of said longitudinal carrier tape such that a portion of each of the lengths of the pressure sensitive tape extends over each aperture with the adhesive portions of the two lengths of tape facing into the aperture and with the pair of parallel lengths of pressure sensitive tape separated by a gap;

d. whereby a small component can be inserted into each aperture from the upper surface and retained thereby by the portion of the adhesive surface of the pair of parallel lengths of pressure sensitive adhesive tape. restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to show all of the various forms or modification in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A method of adjusting a tape-to-component binding strength for use in an automated packaging and releasing process for retaining small components, the method comprising the steps of:

a. preparing a longitudinally elongated carrier tape having a lower side and an upper side and comprising a plurality of hexahedron shaped aperture cavities for accommodating said small components respectively;

b. providing a pair of pressure sensitive adhesive tapes each having an adhesive surface;

c. aligning said pair of pressure sensitive adhesive tapes longitudinally in parallel with a lateral gap therebetween and having their said adhesive surfaces facing said lower side of said carrier tape;

d. adjusting said gap between said pair of pressure sensitive adhesive tapes;

e. affixing said adhesive surfaces of said pair of pressure sensitive adhesive tapes to said lower side of said carrier tape and having each one of said plurality of aperture cavities partially overlapped by said pair parallel pressure sensitive adhesive tapes; and f. placing said small components into said plurality of aperture cavities respectively and causing said small components to be partially bound to said pair of parallel pressure sensitive adhesive tapes;

g. whereby when said small components are retained within said plurality of aperture cavities respectively, said tape-to-component binding strength is determined by said adjusted gap, independent of the adhesiveness of said adhesive surfaces of said pair of pressure sensitive adhesive tapes.

2. A method of adjusting a tape-to-component binding strength for use in an automated packaging and releasing process which utilizes a double sided carrier tape with a plurality of aperture cavities for retaining small components respectively, the method comprising the steps of:

a. providing at least two pressure sensitive adhesive tapes each having an adhesive surface;

b. aligning said at least two pressure sensitive adhesive tapes in parallel with a gap therebetween;

c. adjusting said gap between said at least two pressure sensitive adhesive tapes; and d. affixing said adhesive surfaces of said at least two pressure sensitive adhesive tapes to one side of said carrier tape and having said plurality of aperture cavities partially bound to said at least two parallel pressure sensitive adhesive tapes, said tape-to-component binding strength is determined by said adjusted gap, independent of the adhesiveness of said adhesive surfaces of said at least two pressure sensitive adhesive tapes.

* * * * *